United States Patent [19]

Bobeck et al.

[11] 4,010,454
[45] Mar. 1, 1977

[54] MAGNETIC BUBBLE SIGNAL GENERATOR

[75] Inventors: Andrew Henry Bobeck, Chatham; Irynej Danylchuk, Morris Plains, both of N.J.

[73] Assignee: Bell Telephone Laboratories, Incorporated, Murray Hill, N.J.

[22] Filed: May 30, 1974

[21] Appl. No.: 474,703

[52] U.S. Cl. ............... 340/174 TF; 179/90 BB
[51] Int. Cl.[2] ............ G11C 11/14; H04M 1/46
[58] Field of Search .......... 340/174 TF, 174 SR; 328/59; 179/90 BB

[56] References Cited

UNITED STATES PATENTS

| | | |
|---|---|---|
| 3,812,480 | 5/1974 | Kish et al. ............ 340/174 TF |
| 3,820,092 | 6/1974 | Bobeck et al. ............ 340/174 TF |
| 3,879,585 | 4/1975 | Bobeck et al. ............ 340/174 TF |
| 3,895,363 | 7/1975 | Braginski ............ 340/174 TF |

*Primary Examiner*—James W. Moffitt
*Attorney, Agent, or Firm*—Herbert M. Shapiro

[57] ABSTRACT

A magnetic memory including a number of magnetic bubble recirculating loops and a common channel controls the frequency of signals generated by flip-flops connected to a bubble detector in the common channel. A choice of two-out-of-seven loops for bubble storage permits the control of the flip-flops in a manner to provide a multi-frequency output useful for TOUCH-TONE telephone dialing operation.

19 Claims, 6 Drawing Figures

MAGNETIC BUBBLE SIGNAL GENERATOR

FIELD OF THE INVENTION

This invention relates to magnetic signal generating apparatus and more particularly to such apparatus including magnetic storage arrangements.

BACKGROUND OF THE INVENTION

Magnetic storage arrangements in which information is represented in terms of single wall domains such as magnetic bubbles are well known. When a number of bubble channels are defined in a single layer of material by a pattern of magnetic elements which cause the movement of bubbles in response to a magnetic drive field reorienting (i.e., rotating) in the plane of the layer, the arrangement is termed a "field-access" arrangement.

U.S. Pat. No. 3,618,054 of P. I. Bonyhard, U. F. Gianola and A. J. Perneski, issued Nov. 2, 1971 discloses a "major-minor" organization for field-access, bubble memories. The channels in such an organization are defined as loops in which bubble patterns are recirculated as the drive field rotates. These loops are permanent stores and are called the minor loops. A single accessing channel is employed to move information from the minor loops to a write and read port for manipulation. This accessing channel is called the "major loop" if defined as a recirculating channel and is called a "major path" if information is not returned by the path to the originating minor loop. Information is usually transferred to and later returned from the major loop if a major loop is employed. If a major path is employed, bubble movement between the minor loops and the major path typically is accomplished by replication followed by annihilation of the replicated information. Transfer, annihilation, and replication implementations are known in the art.

It is also known to employ oscillators to generate tones of the type employed, for example, in TOUCH-TONE telephone handsets. The tones are usually generated in pairs, one-out-of-four low frequency tones and one-out-of-three high frequency tones corresponding to a three by four pushbutton array familiar to telephone subscribers.

BRIEF DESCRIPTION OF THE INVENTION

The present invention is directed at a bubble-controlled multifrequency tone generator useful for TOUCH-TONE applications. To realize a familiar two-out-of-seven multifrequency tone generator, seven bubble recirculating loops (minor loops) are employed. The loops have different numbers of stages and are associated with coded ones of the stages of a major path. A detector is coupled to a detection stage in the major path. A bubble is introduced to each of a coded two-out-of-seven of the minor loops and advanced, by the rotating field, around the respective loops periodically through reference positions. In response to periodic control pulses occurring when bubbles occupy the reference positions, the bubbles are replicated repeatedly into the major path for movement to the detector. A succession of like bubble codes, each consisting of a pair of bubbles separated by a coded distance (number of stages) is formed in the major path in this manner.

To produce a two-out-of-seven code, the minor loops are related by sets, one set of four, a low frequency set; the remaining three, a high frequency set. The coded stages in the major path are chosen so that replication from any low frequency loop results in the arrival of a bubble at the detector in an even cycle of the in-plane field whereas a bubble from a high frequency loop arrives at the detector during an odd cycle. A flip-flop driven synchronously with the in-plane field enables, alternately, first and second toggle flip-flops to be activated by each detector output. Because the detector outputs relate alternately to the first and then the second bubble of each code, and since those codes are repeated, the alternately enabled flip-flops thus provide square wave output signals with (different fundamental) frequencies determined by the timing (the number of in-plane field cycles) between successive first bubbles of successive codes and the timing between second bubbles of those codes as well as by the numbers of stages in the major path (or paths) separating the selected loops from the detector and the frequency of the in-plane field.

DETAILED DESCRIPTION

Figure 1:
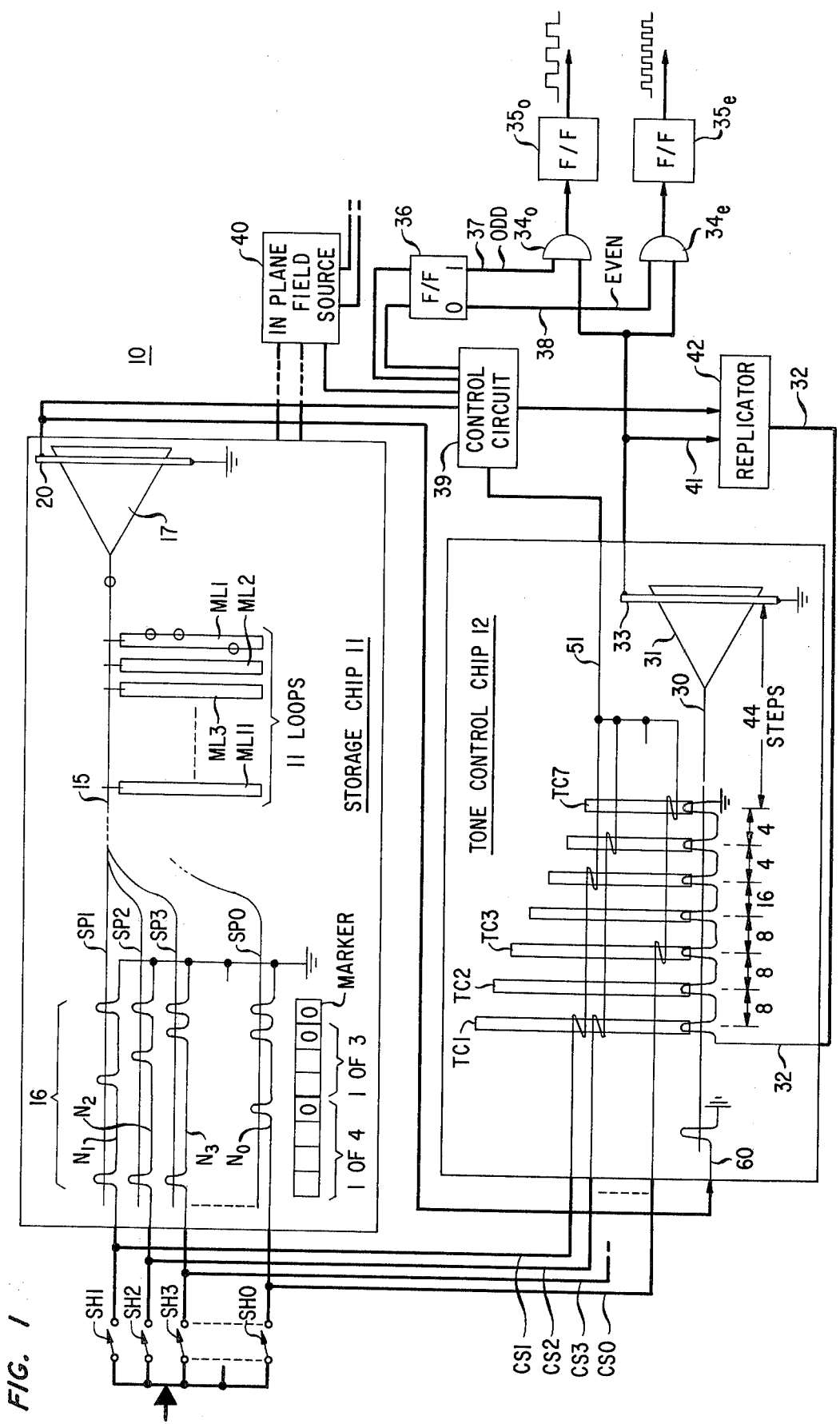
FIG. 1 is a schematic representation of a magnetic bubble memory arrangement for a TOUCH-TONE repertory dialer including a tone-generating arrangement in accordance with this invention.

FIG. 1 shows, schematically, a bubble TOUCH-TONE generator arrangement 10 including a bubble "storage" chip 11 and a bubble "tone-control" chip 12. A plurality of bubble recirculating loops and paths is defined in each of the chips for operation in the familiar "field-access" mode and are represented by solid lines in the figure.

Copending application Ser. No. 443,960 now U.S. Pat. No. 3,879,585 of A. H. Bobeck, R. F. Fischer, J. E. Geusic and T. J. Nelson discloses, inter alia, bubble repertory dialer system and storage chip design similar to the type shown in FIG. 1. The invention herein relates primarily to the tone-control chip 12 and the cooperation of that chip with the storage chip in, for example, systems of the type disclosed in that copending application, for controlling the generation of multifrequency signals.

The storage chip and its operation will be described briefly to provide a context for an understanding of the present invention. The storage chip includes a major path 15 extending from an input portion 16, on the left as viewed in the figure, to an expansion detector portion 17 to the right as viewed. In the present embodiment, the input portion includes a number of merging bubble propagation channels SP1, SP2, SP3, . . . , operative as a parallel set of spur tracks, instead of the serial input arrangement described in the above-mentioned copending application. The serial arrangement may be used herein with only minor adaptation of the input logic as shown in that copending application to provide a two-out-of-seven code as employed herein.

A plurality of switches designated SH1, SH2, ... SH0 are associated with the input portion as shown in the figure. The closure of a switch, during a write operation, causes a pulse from a source (not shown) to be applied to an associated one of a set of "bubble-nucleate"-conductors N1, N2, ... N0. The nucleate conductors are coupled to chip 11 in a manner to generate a bubble pattern, when pulsed, to provide a "marker" bubble plus two information bubbles. The information bubbles are spaced at coded, two-out-of-seven, positions along an associated one of spur tracks SP1, SP2, SP3, ... SP0 for immediate advancement into major path 15.

Each pair of bubbles, moreover, constitutes a code representing a decimal digit of a "dialed" number. The code is shown at the lower left corner of the storage chip (11) as viewed in the figure. The undulations in the various conductors represent bubble nucleation sites and can be seen to correspond to the code. The decimal digit information of a telephone number "dialed" is queued in this fashion in path 15, the successive digits being entered into associated spur tracks and advanced in each instant until the entire stored number resides in that path.

Note that spur track SP1 constitutes a portion of path 15 in the illustrative embodiment. A bubble code, generated in spur track SP1, moves to the right, as viewed in the figure, along path 15 in familiar fashion when the in-plane field is activated. The remaining spur tracks are designed to merge with path 15 to advance a code similarly from one of those tracks into path 15 in each instance. The lengths of the tracks (numbers of stages) is chosen so that, regardless of which track originates the information, advancement to a predetermined position in path 15 is ensured. An advance of information of at least sixteen stages is needed to clear the spur tracks because each digit code (along with a marker bubble) has eight bits and each bit position conveniently occupies two stages of a bubble channel in the illustrative embodiment.

The overall operation of the storage chip is substantially as described in the above-mentioned copending application. Suffice it to say that the information queued in path 15 during a write operation ultimately is stored (by replication) in a selected repertory minor loop of the set of loops ML1, ML2, ... ML11, as well as advance to the detector arrangement 17 for generating pulses in detector 20. Similarly, information stored in the minor loops, is (replicated into path 15 and) advanced to the detector in response to the depression of a repertory pushbutton (not shown) during a read operation. It will be seen that the outputs of the detector arrangement 17 are applied only to tone-control chip 12 in the illustrative embodiments although simultaneous outdialing can be provided for in a straight-forward manner.

In a first illustrative embodiment herein, bubble codes for controlling multifrequency tones are generated in the tone-control chip in response to those outputs when the system is operated as a repertory and a repertory pushbutton selection occurs during the read operation or in response to a parallel input operation directly into the tone-control chip during a write operation. We will now turn out attention to the tone-control chip to consider an illustrative implementation for controlling and generating tones.

The tone-control chip comprises a plurality of minor loops which are hereafter termed "tone-control" loops herein. The tone-control loops unlike conventional minor loops all have differing numbers of stages. The loops are designated TC1, TC2, ... TC7 as is shown in FIG. 1. Ten electrical conductors CS1, CS2, ..., for applying coded bubble-generation signals to the tone-control loops, are shown in the figure also. The conductors are coupled to chip 12 so that when a selected conductor is pulsed in response to the closure of a corresponding switch (SH1 ... SHo) during a write operation, a bubble is generated in each of an associated two-out-of-seven of the tone-control loops simultaneously with the provision of the bubble code in the storage chip. The conductors are shown connected electrically in parallel to the switches in FIG. 1.

Figure 2:
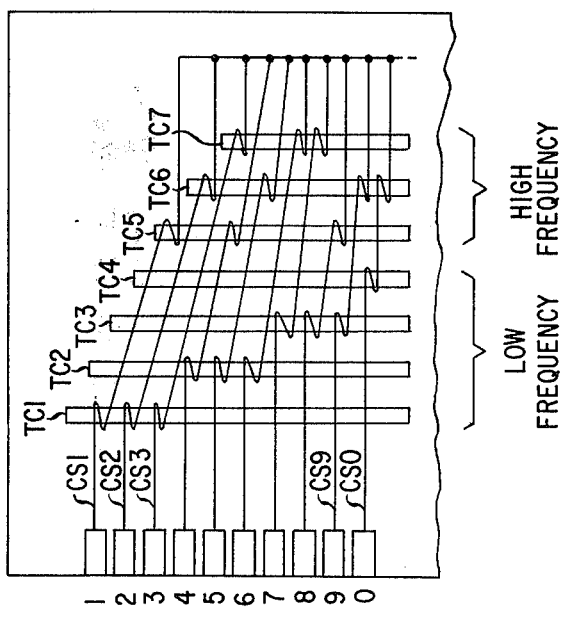
FIG. 2 is a schematic representation of a portion of the memory of FIG. 1.

The association of a conductor and its tone-control loops is represented in FIG. 2 by the undulations in the conductor indicating a point of bubble generation. It can be seen that conductor CS1 couples loops TC1 and TC5. Similarly, conductor CS2 couples loops TC1 and TC6, etc., the pattern of couplings being equivalent to a known binary code. A pulse in conductor CS1, thus, generates a bubble in an associated stage of each of loops TC1 and TC5. The stages occupied by the bubbles in each instance are initially equal numbers of stages from a reference position, in the respective loops, closely spaced with respect to an associated position in major path 30. In operation, the bubbles are moved, in the illustrative embodiment, in a manner to occupy those reference positions repeatedly but not simultaneously as is described in greater detail hereinafter.

A repertory dialer system, as described in the above-mentioned copending application, advances all information in memory (i.e., chip 11) by the activation of the familiar rotating in-plane field common to field-access, bubble memories. A similar field rotates to produce bubble movement synchronously in the tone-control chip as well, rotation occurring illustratively at a 63.5-kilohertz rate in order to produce TOUCH-TONE signals. The tone-control loops are spaced apart along the major path in a coded manner determinative of the tone generated by the arrangement of FIG. 1 illustratively in the presence of that 63.5-kilohertz field.

In one embodiment of this invention, the loops TC1 to TC7 have the numbers of stages and result in the nominal frequencies shown in the following Table I:

TABLE I

| | Nominal Frequency (f) | No. of Stages | "Tone Control" loop |
|---|---|---|---|
| Low-Frequency Group. | 697Hz | 92 | TC1 |
| | 770 | 84 | TC2 |
| | 852 | 76 | TC3 |
| | 941 | 68 | TC4 |
| High-Frequency Group | 1209 | 52 | TC5 |
| | 1336 | 48 | TC6 |
| | 1477 | 44 | TC7 |

Figure 3:
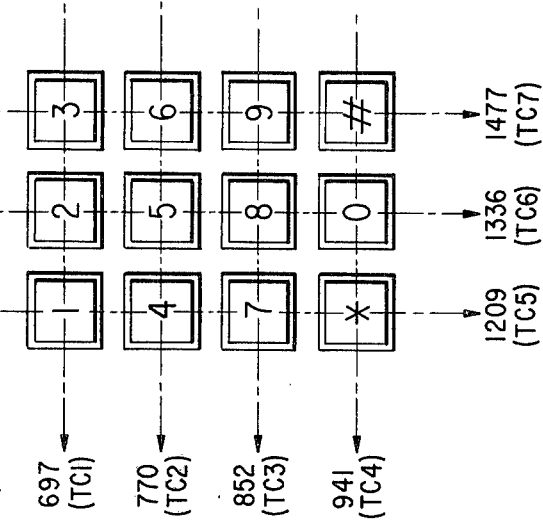
FIG. 3 is a schematic representation of a button array of a TOUCH-TONE dialer for operation of the memory of FIG. 1.

FIG. 3 shows a familiar digit-select pushbutton array with related nominal frequencies designated. The depression of a selected button during a write operation is operative to close an associated switch (SH1 ... SHO) and results in the direct entering of a bubble in each of the associated tone-control loops for generation of the associated frequencies as shown in the table and figure. The depression of the button also initiates a bubble advance operation in both the storage and the tone-control chips in a manner similar to that described in the above-mentioned copending application. The button depression further provides a delayed replicate pulse to replicate an initial representation of the stored digit into the major path as is described more fully hereinafter. Bubble advance in the tone-control chip lasts typically for 50 milliseconds' duration, the minimum time during which a pushbutton can be depressed.

The recirculation of a bubble in each of the selected tone-control loops results in those bubbles periodically occupying the reference positions which are in close proximity to associated (and coded) stages in major path 30. The bubbles in the reference positions are replicated into the associated stages of the major path in response to periodic replication pulses in a conductor serially coupling those positions as will become clearer hereinafter. Path 30, in turn, is operative to move bubbles to an expansion detector arrangement 31 (of FIG. 1) in a manner similar to and synchronous with the movement of bubbles in the tone-control loops.

The periodic replication of bubbles from the tone-control loops establishes interleaved coded bubble patterns in the major path 30. To this end, a conductor 32 (see the tone-control chip) couples all the associated reference positions and (coded) stages electrically in series and is operative when pulsed to replicate into path 30 any bubble occupying any one of the reference positions. Of course, since only a selected two-out-of-seven loops are occupied by bubbles at any one time since the loop lengths are different only one bubble is properly positioned at a time. Moreover, each replicate pulse, further occurs when that bubble is in the coupled position of the loops as will become clear hereinafter. Each pulse in conductor 32 is operative, accordingly, to replicate a bubble in one of the reference positions in the selected (two-out-of-seven) loops, successive pulses being operative to establish the repetitive bubble code in path 30 for advancement to the expansion detector.

The resulting succession of bubble codes in path 30 controls the tones generated by the arrangement of FIG. 1. The expansion detector includes a magnetoresistance detector 33. In practice, two detectors are used in consecutive bit positions of the major path and are connected in a familiar bridge arrangement. Each bubble in path 30 produces a pulse in detector 33 prior to being annihilated by well-known means not shown. Typically a familiar guard ring structure is integrated with the expansion detector arrangement for this purpose.

Each pulse so generated is applied to an input of each of AND circuits $34_o$ and $34_e$. The outputs of AND circuits $34_o$ and $34_e$ are connected to toggle flip-flops $35_o$ and $35_e$, respectively. A third toggle flip-flop 36 is employed to activate AND circuits $34_o$ and $34_e$ in the alternative. To this end, first and second outputs 37 and 38 of flip-flop 36 are connected to inputs of circuits $34_o$ and $34_e$, respectively. The inputs of flip-flop 36 are connected to control circuit 39 for synchronization with the rotating field source(s) represented by block 40 in FIG. 1 in a manner to set and reset flip-flop 36 for alternative (i.e., odd and even) cycles of the in-plane field.

The tone-control loops are arranged along major path 30 so that high frequency loops, TC5, TC6, and TC7 introduce bubbles to stages of the major path corresponding to odd cycles of the in-plane field. That is to say, a bubble introduced by a high frequency loop arrives at the detector during an odd cycle. Similarly, the low frequency loops introduce bubbles to stages corresponding to even cycles. The first "low-frequency" bubble of a bubble code in path 30 thus is operative to set flip-flop $34_e$, for example, whereas the first "high-frequency" bubble is operative to set flip-flop $34_o$ occurring on the even and the odd cycles of the in-plane field, respectively. The second low- and high-frequency bubbles (of the next subsequent bubble code in path 30) similarly are operative to reset flip-flops $34_e$ and $34_o$, respectively. As long as the bubbles are replicated in a manner to establish the appropriate separations along channel 30, flip-flops $34_e$ and $34_o$ are set and reset in a manner to control the signals generated thereby. In this manner, the requisite signals and thus the requisite tones are produced by flip-flops $35_e$ and $35_o$ in (at least) 50-millisecond bursts each time a digit-selection button of FIG. 3 is in a depressed condition.

Since it takes two consecutive bubbles from a tone-control loop to control a single output pulse, a rotating field of double the 63.5 kH noted above is employed with the arrangement of FIG. 1. If a low pass filter is employed instead of the flip-flops, the 63.5 kH field is used.

The repetitive replication of bubble codes into major path 30 from the tone-control loops is conveniently controlled by pulses in the magnetoresistance detector 33. To this end, a conductor 41 is connected between a replicator circuit 42 in FIG. 1 and the magnetoresistance detector 33. Each time a pulse occurs in the detector, ciruit 42 is activated for applying a pulse to conductor 32 for replicating bubbles from the tone-control loops into the major path 30. Thus, each bubble of a bubble code providesthe timing for replicating into path 30 the next subsequent-like bubble in the succession of codes moving along path 30.

In order to ensure that the replication pulses occur when bubbles are in the replicate positions, the loops TC7 . . . TC1 couple positions along channel 30 separated illustratively 44, 48, 52, 68, 76, 84, and 92 stages from detector 33, respectively. These separations can be seen in Table I to correspond to the number of stages in the associated tone-control loops. The choice of separations ensures that the bubble from the selected one of loops TC5, TC6, and TC7 arrives at the detector during an odd cycle of the in-plane field and that the bubble from the selected one of the remaining loops arrives during an even cycle as mentioned hereinbefore.

Although the tone-control loops are separated from detector 33 only a relatively few stages, the relationship between the codes generated by those loops and the control they exercise over the outputs of the flip-flops is easier to understand if we imagine that separation is much greater. Remember this greater separation is imaginary and is employed only to aid in understanding. In practice the separation is kept small to economize in chip size.

Figure 4:
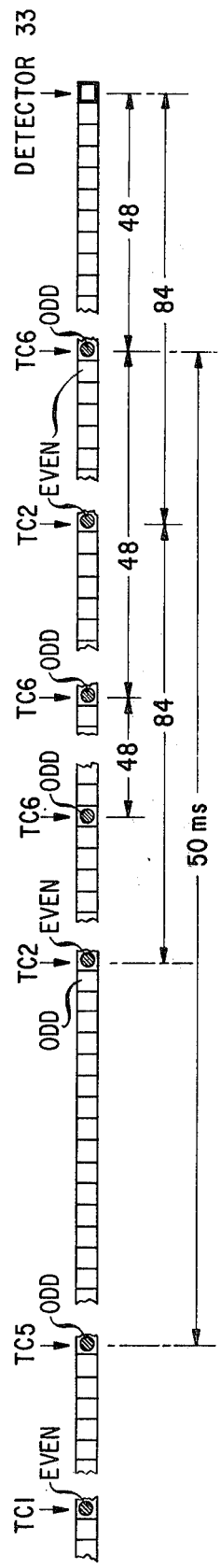
FIG. 4 is a schematic representation of an imaginary segment of a portion of the arrangement of FIG. 1.

FIG. 4 shows segments of an imaginary enlarged major path (30 of FIG. 1) where each box represents a stage of the path and each darkened circle represents a bubble. The number 5 button of FIG. 3, for example, when depressed, results in a bubble in loops TC2 and TC6 which illustratively have 84 and 48 stages, respectively, and are associated with coded stages 84 and 48 positions (stages) from the detector. These loops (periodically) move bubbles to replicate positions every 84 and 48 cycles of the in-plane field, for replication into the major path. The bubbles in the stages of path 30 originating from loop TC6 may be thought of as in positions 48, 96, 144, etc. stages from the detector when a (first) bubble originally replicated from TC6 reaches detector 33 (in our imaginary elongated path). The positions of the bubbles are shown in FIG. 4. At the assumed 127-kilohertz rate for the in-plane field, the high-frequency bubbles (viz: from TC6 in FIG. 4) produce pulses at twice the associated 1336 cycles (indicated in the above table) every first pulse setting flip-flop $34_o$ and every alternate pulse resetting that flip-flop to produce the nominal 1336 pulse rate.

Interleaved with this high-frequency representation is the low-frequency representation of bubbles separated by 84 stages as shown in FIG. 4 also. The low-frequency bubbles cause ouputs at twice the nominal 770 cycles first to set and alternately to reset flip-flop $34_e$ during even cycles of the in-plane field. Thus, the flip-flops are controlled in a manner to provide the multi-frequency output produced by existing TOUCH-TONE dialers as represented by the waveform shown to the right of flip-flops $34_o$ and $34_e$ in FIG. 1.

By the time the button for a next subsequent digit is depressed, a minimum of 50 milliseconds has passed. In this period, a minimum of 61 high-frequency square wave pulses and 35 low-frequency square wave pulses occur. The 50-millisecond timing is indicated in FIG. 4 for the digit 1, following the digit 5. The square wave outputs include fundamental frequencies substantially equivalent to presently used TOUCH-TONE frequencies.

When that next subsequent (digit-select) button is depressed, the bubble representation previously stored in the tone-control loops is annihilated at the reference positions in the various loops. The annihilation is most simply realized by changing the phase of the replicate (cut) pulse in conductor 32 with respect to the in-plane field at the time some final pair of replication operations normally occurs. A field-access operation of a combination replicate-annihilate function operative to this end is described in the above-mentioned copending application. Such operation is implemented herein by connecting each of conductors CS1, CS2, CS3 . . . of FIG. 1, to control circuit 39 by a common conductor 51 as shown in FIG. 1. In response to a switch closure, circuit 39 applies a signal to replicator circuit 42 to annihilate the code representation of the digit stored in response to that switch closure. The annihilate pulses are timed to occur after a delay of 50 milliseconds and operate to clear the tone-control loops for the next subsequent bubble code. But, the timing is not critical since the coded bubbles of a digit representation are recirculated at a sufficiently high rate to occupy the associated coded positions in path 30 many times, while the pushbutton is depressed, before the annihilate pulses occur.

The arrangement of FIG. 1 operates differently during a read operation. The output of detector 20 of the storage chip is applied only to conductor 60 of the tone-control chip in the illustrative embodiment. The outputs are operative to generate the bubble representation of the selected digit directly into path 30 of the tone-control chip when those outputs occur. Remember that during a write operation initially, when a digit-select button is depressed, bubble codes are entered into, and bubble movement occurs synchronously in both the storage and tone-control chips under the control of control circuit 39. Thus, when an output occurs at detector 20 during a write operation bubble generation already was occurred in the tone-control loops. Accordingly, outputs generated by detector 20 during a write operation are inhibited under the control of control circuit 39 conveniently by disabling the generator at conductor 60 in a well-understood manner.

During a read operation, on the other hand, no parallel input to the tone-control chip occurs and the outputs from detector 20 are not inhibited. A read operation is initiated when a minor loop in the storage chip is selected for replicating stored information into the major path 15 for advancement to detector 20. The selected information is queued, in the entirety, in the major path before the marker bubble associated with the first digit arrives at the detector by the provision of a maximum of seven hundred and twenty successive replicate pulses at the access port to the selected storage loop essentially as described in the above-mentioned copending application.

In response to the arrival of the marker bubble for the first signal for of the selected number, detector 20 applies a signal to control circuit 39 for initiating a counter assumed to be included therein. The counter is operative to provide a signalfor terminating the in-plane field in the storage chip after sixteen cycles thereof and to apply a pulse to conductor 32 at that time. The ports to the tone-control loops are assumed to be separated from the (input) stage of path 30, coupled by conductor 60, so that at the termination of the sixteen cycles, the bubble code representative of the first digit occupies positions for replication into the proper tone-control loops when the pulse in conductor 32 occurs. In this manner, information from the storage chip is initially entered into the tone-control loops for recirculation during a read operation.

The information replicated at the ports to the tone-control loops during a read operation also continues to advance along path 30. When that information reaches detector 33, replicator circuit 42 is activated and, in turn, pulses conductor 32 for affecting the generation of a next replicate pulse in conductor 32. In this manner, successive code representations of the first digit are generated in path 30 for controlling the frequencies generated by the arrangement of FIG. 1 as was the case during a write operation.

At the termination of the assumed 50-millisecond tone-generation operation, control circuit 39 annihilates the bubbles in the tone-control loops, as before, and initiates the in-plane field in the storage chip for advancing the bubble code representation of the second stored digit. In this instance, the annihilation operation occurs 50 milliseconds after the first pulse in conductor 60. The outputs from the storage chip during a read operation thus occur in the first sixteen cycles of each 50-millisecond tone-generation period, control circuit 39 operating to first initiate the sixteen cycles and to then deactivate the in-plane field for the storage chip for the remainder of the 50-millisecond period. It should be clear that in this embodiment, two separate field generating means are employed for the two chips of FIG. 1. This, of course, need not be the case as will become clear hereinafter.

The read operation terminates under the control of control circuit 39 in response to a null occurring in the first cycle of the sixteen cycles during which the in-plane field in the storage chip is operative. The null signifies the absence of a marker bubble and thus the prior passage of the representation for the last digit of the stored number.

The marker bubble accompanying each digit representation is also reproduced in path 30 via conductor 60 shown in FIG. 1. But, the marker bubble can be ignored because replication of bubbles from the major path into the tone-control loops occurs at a time when no tone-control loop is in a position to receive the marker bubble. Therefore, the marker bubble does not occur in the repetitive representation of a decimal digit herein.

The marker bubble, on the other hand does move along the major path (30) in the initial representation of a decimal digit to generate an output. This output may be ignored herein because it only negligibly affects the tone generated by the arrangements herein and causes a pulse in conductor 32 when no bubbles are in positions to be replicated from the tone-control loops into major path 30 in response.

We have now seen how repetitive bubble codes are replicated from control loops into a major path for controlling pulses generated in response to the arrival of those bubbles at a detector in that path. It remains to be shown how bubbles entered into those control loops by conductors CS1 to CS0 are first replicated into the path for movement to the detector.

The initial replication occurs under the control of control circuit 39 by means of a timed pulse applied to conductor 32 by replicator 42. Since conductors CS1 to CS0 generate bubbles in selected tone-control loops at stages like numbers of steps from the replicate positions, a replicate pulse in conductor 32 is operative to perform the initial replication in the cycle of the in-plane field during which those bubbles occupy those replicate positions. If all the bubbles, generated in tone-control loops, originally occupy at stages, say, five stages removed from the replicate position, a pulse in conductor 32 during that fifth cycle is operative to provide the initial replication. Control circuit 39 is assumed to include a counter operative to this end. If bubble generation occurs in different stages of the control loops depending on the digit button selected, the counter may be adapted to respond to the digit button depressed to provide the initial replicate pulse at an appropriate time.

It has been shown that a bubble memory arrangement is useful for generating tones for TOUCH-TONE dialing. The tones themselves are actually generated by signal generators such as flip-flops $35_o$ and $35_e$. The control for the generators comprises the bubble circuit. The frequencies at which the signals are generated are determined by the separation between the detector 33 in the tone-control chip and the various coded stages therein into which bubble pattens, representative of the stored digit in each instance, are provided. The tone-control loops associated with those coded stages are operative to supply bubbles at selected ones of those coded stages repetitively during the accepted 50-millisecond outdialing period.

It should be understood that during a read operation in the foregoing embodiment, the tone-control chip processes the output of the storage chip into a control code for multifrequency signals. Alternative embodiments of this invention, on the other hand, employ the tone-control chip to process the output of the storage chip even during a write operation.

Figure 5:
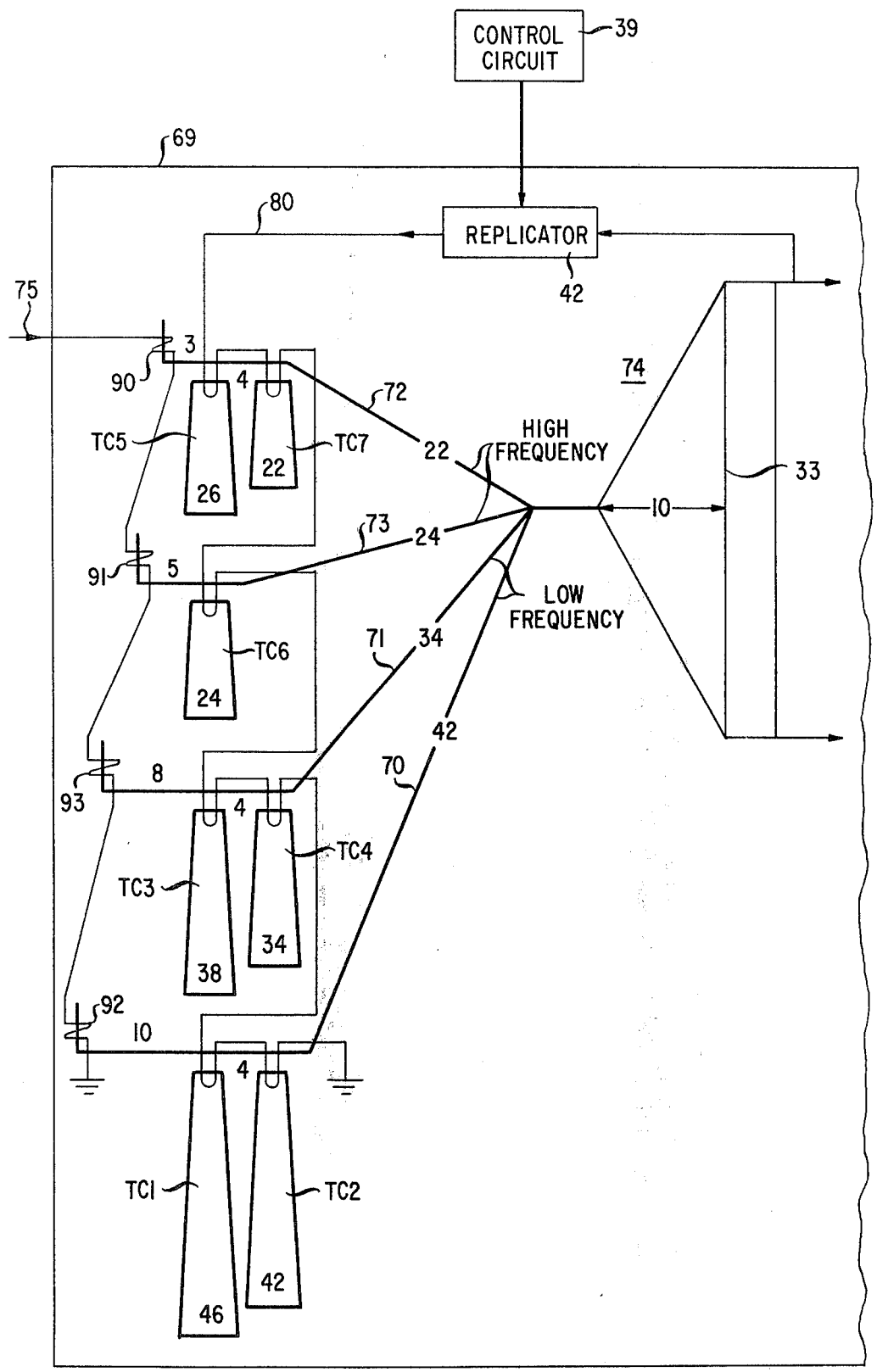
FIGS. 5 and 6 and schematic representation of a portion of an alternative arrangement for controlled generation of signals in accordance with this invention.

FIG. 5 shows a tone-control) chip for an embodiment of this invention in which direct input into the chip, for example, via the conductors CS1, CS2, . . . CS0 of FIG. 1, is absent. All inputs to the tone-control loops during either a read or a write operation occur by replication from the major path of the tone-control chip into the tone-control loops. All inputs to the major path occur, moreover, in response to signals from the magnetoresistance detector of the storage chip. The embodiment is operative essentially as described in connection with the embodiment of FIG. 1 except that the outputs from detector 20 are not inhibited during a write operation. Rather they are entered into the tone-control chip as described for a read operation in the embodiment of FIG. 1.

The tone-control chip 69 of FIG. 5 can be seen to differ in organization from that of FIG. 1. The primary difference is that the tone-control loops are organized into four sets along four major paths rather than a single major path as in FIG. 1. The tone-control loops are designated TC1, TC2, . . . TC7 as in FIG. 1 for ease of comparison. The major paths are designated 70, 71, 72, and 73 in the figure. The numbers of stages in the loops are 46, 42, 38, 34, 24, 26, and 22, respectively, as is also indicated in the figure. Four stages separate the loops along the respective major paths. The numbers of stages separating loops TC2, TC4, TC6, and TC7 from the detector stage of expansion detector arrangement 74 are 42, 34, 24, and 22, respectively. The number of stages in the expansion detector arrangement prior to the detector stage is 10. The various numbers of stages are indicated in the figure.

The major paths have bubbles generated therein via pulses applied to the equivalent of conductor 60 of FIG. 1. This equivalent conductor is designated 75 in FIG. 5 and can be seen to couple input positions of channels 70, 71, 72, and 73 electrically in series. Since there is no direct connection between the switches SH1 to SH0 of FIG. 1 and the tone-control chip of FIG. 5, all digit representations to be converted to tone controls by the tone-control chip are represented as like bubble codes in the major paths 70, 71, 72, and 73 in response to pulses in conductor 75.

The bubble codes in the major paths are distributed to the proper tone-control loops as determined by the numbers of stages separating the bubble generators in the major paths and the reference positions of (ports to) those loops. The numbers of stages, for example, determine the positions occupied by the bubbles in the major path when the equivalent of replicator conductor 32 of FIG. 1 is pulsed and thus the loops into which they are replicated. This equivalent is designated 80 in FIG. 5 and can be seen to couple all the ports to the minor loops electrically in series.

Figure 6:
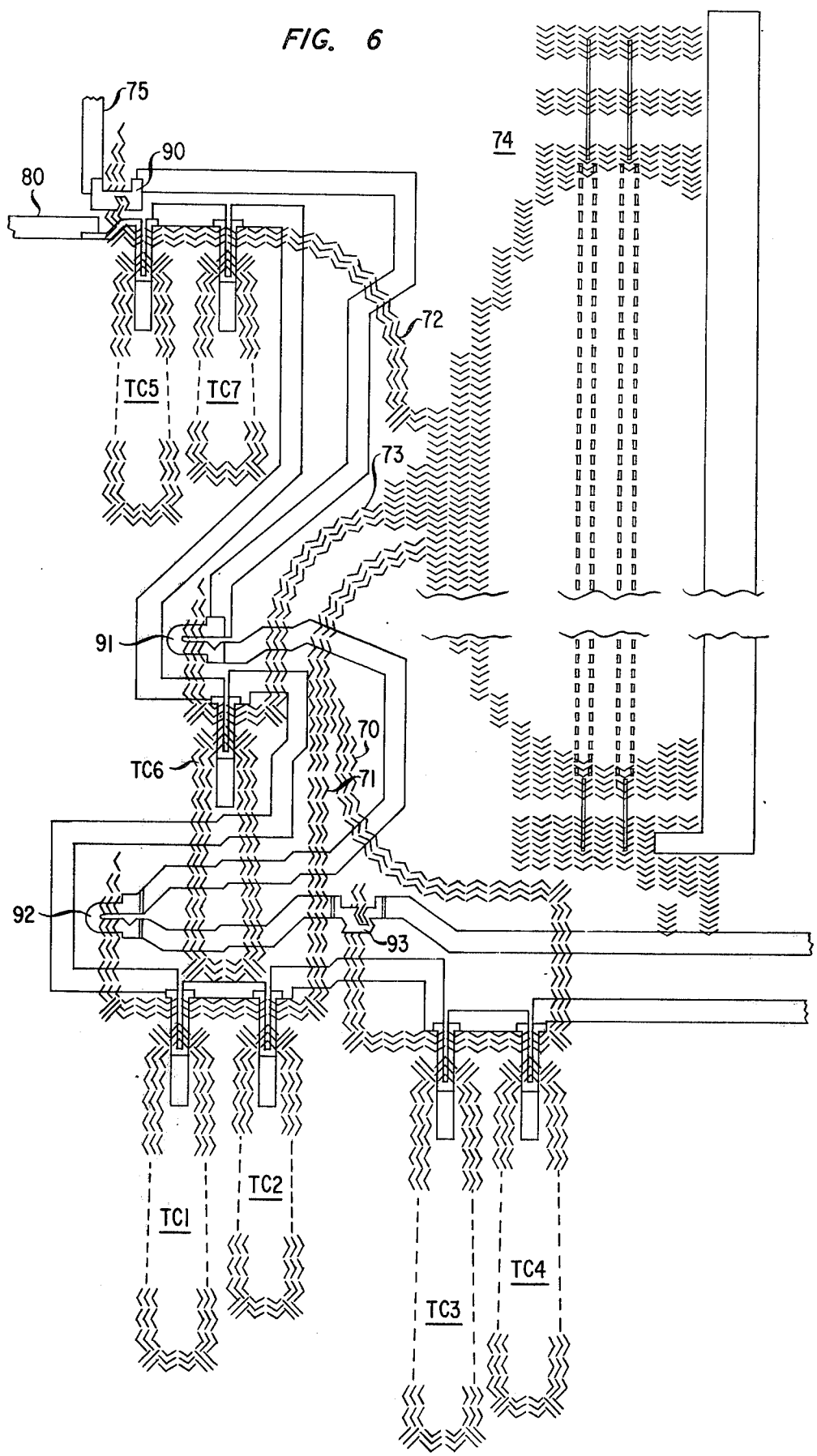

FIG. 6 show the permalloy pattern and the conductor design for a tone-control chip of the type shown in FIG. 5. The various paths 70, 71, 72, and 73 as well as their manner of merging is shown in the figure. The various paths are defined illustratively by chevronshaped elements (of permalloy). The replicate-annihilate elements are defined by U-shaped areas along conductor 80 where that conductor corresponds to the port areas where the tone-control loops and the major paths are in close proximity. Four bubble generators 90, 91, 92, and 93 are defined by conductor 75 for generating bubbles in each of the major paths in the figure responsive to signals from detector 20 of FIG. 1.

Although a bubble code representation of a decimal digit, during a read or a write operation, is provided in each of the four major paths, the arrangement of FIGS. 5 and 6 is operative to move the bubbles to only the proper two-out-of-seven tone-control loops upon the occurrence of a pulse in conductor 80.

TABLE II

| Cycle | 16 | 15 | 14 | 13 | 12 | 11 | 10 | 9 | 8 | 7 | 6 | 5 | 4 | 3 | 2 | 1 |
|-------|----|----|----|----|----|----|----|---|---|---|---|---|---|---|---|---|
|       | R  |    |    |    |    |    |    |   |   |   |   |   |   |   |   | M |
| Loop  |    |    | TC5 |   | TC6 |   | TC7 |  | TC3 |  | TC1 |  | TC4 |  | TC2 |   |
|       | High Frequency | | | | | | | | Low Frequency | | | | | | | |

Simply stated, the input operation provides for the marker bubble (M), accompanying each code, to initiate a timing sequence of sixteen cycles of the in-plane field as shown in Table II. During the sixteenth cycle, a replicate pulse (R) occurs in conductor 80 of FIG. 5. During the fourteen cycles following the marker bubble (and prior to R), the bubbles of a code representative of a decimal digit are generated simultaneously in each of the major paths. The bubble code again comprises two bubbles in a two-out-of-seven code. As indicated in Table II, four positions are allocated to the low frequency indications in each instance. These positions (as in the previous embodiment) occur on even cycles of the in-plane field as shown in the Table. Three positions are similarly allocated for the high frequency part of the code. The high frequency positions correspond to odd cycles of the in-plane field. The allowable positions for the bubbles are shown darkened in the Table. Nucleation conductors such as N1 ... N0 of FIG. 1, for storage chips compatible with the embodiment of FIGS. 5 and 6 are configured to provide a new code when pulsed.

When the replicate pulses occur in conductor 80, the bubbles of the code, representative of the decimal digit selected, occupy like positions in each major path from which they are replicated into the associated loops of FIG. 5 as indicated in Table II. This positioning is achieved by a judicious choice of the number of stages between the bubble generators in the various major paths and the ports to the minor loops as has already been stated. The numbers of stages are shown in FIG. 5 to be 3 stages 5 stages, 8 stages, and 10 stages between the bubble generators in paths 72, 73, 71, and 70 and loops TC5, TC6, TC3, and TC1, respectively. Loop TC7 is four stages from loop TC5, loop TC4 is four stages from loop TC3, and loop TC2 is four stages from loop TC1 as is also indicated in the figure. To store a representation of the decimal digit No. 8, then, the bubble code requires a bubble in each of loops TC6 and TC3 in accordance with the convention shown in Table III:

TABLE III

| Decimal Digit | T.C. Loop - high v | T.C. Loop - low v |
|---------------|--------------------|--------------------|
| 1 | TC5 | TC1 |
| 2 | TC6 | TC1 |
| 3 | TC7 | TC1 |
| 4 | TC5 | TC2 |
| 5 | TC6 | TC2 |
| 6 | TC7 | TC2 |
| 7 | TC5 | TC3 |
| 8 | TC6 | TC3 |
| 9 | TC7 | TC3 |

TABLE III-continued

| Decimal Digit | T.C. Loop - high v | T.C. Loop - low v |
|---------------|--------------------|--------------------|
| 0 | TC6 | TC4 |

Bubbles, accordingly, are generated in each of major paths 70, 71, 72, and 73 of FIG. 5 during the eighth and the eleventh cycle of the in-plane field after the marker bubble as is clear from Table II. The replicate pulse (R in Table II) in conductor 80 occurs during the sixteenth cycle after the marker allowing the bubbles to advance eight and five stages, respectively, in each major path prior to replication.

A glance at FIG. 5 indicates that the first bubble in path 71 is properly positioned to enter loop TC3 whereas the second bubble in path 72 is properly positioned to enter loop TC6 when the replicate pulse occurs.

The decimal digit No. 10 (No. 0), requiring bubbles in loops TC4 and TC6 (see Table III), similarly is represented by bubbles entered into paths 70, 71, 72, and 73 during the fourth and the eleventh cycle of the in-plane field after the marker. The replicate pulse thus allows twelve and five cycles respectively for the bubbles to be positioned. A glance at FIG. 5 shows that the first bubble in path 71 is properly positioned for replication into loop TC4 whereas the second bubble in path 73 is properly positioned for replication into loop TC6 when the replication pulse occurs.

Once the bubbles of a digit are replicated into the proper tone-control loops, operation continues as described in connection with the embodiment of FIG. 1 for both read and write operations.

The remaining bubbles in the major loops are not positioned at ports to minor loops when the replication pulse occurs. They merely move along the major path during later operation to generate a signal during a first portion of the 50-millisecond output burst and only negligibly effect the output frequencies. The code bubbles, on the other hand, are properly stored in minor loops for recirculation to generate repetitive codes for the digit during that burst for controlling the output frequencies as described hereinbefore.

Two arrangements have been described for entering bubble codes into the tone-control loops herein. One is a conductor arrangement employed during a write operation in the embodiment of FIG. 1. In that arrangement, the conductors are coupled to tone-control loops to generate the bubble code directly into stages in those loops when pulsed. In a second arrangement, pulses are generated in a conductor coupled to the major path (or paths) of a tone-control chip. The pulses in the latter case are responsive to pulses generated, for example, by the detector of the storage chip during a read operation in an embodiment of the type shown in FIG. 1 and in both the read and write operations in embodiments of the type shown in FIGS. 5 and 6. With either arrangement, it is important to establish the odd-even relationship mentioned above if it is desired to employ a single detector arrangement in the tone-control chip. Otherwise a space consuming arrangment of first and second expansion detector arrangements is required for the high and low frequency tone-control loops, respectively.

The odd-even relationship is established most simply by properly spacing the tone-control loop (or loops) from the generator (or generators) in the major path (or paths) and by entering the bubbles in an even-numbered and an odd-numbered position for the low and high frequency loops for each digit representation as has been described hereinbefore. The relationship also can be established by delaying the low-frequency information for one stage with respect to the high frequency information detected at the detector of the storage chip if the information is not already in a suitable odd-even form there. Such a delay is achieved by straightfoward techniques well understood in the art. Alternatively, the nucleate conductors N1 . . . N0 are coupled to tracks SP1 to SP0 to ensure that the odd-even relationship is established initially.

In the conductor write arrangement of FIG. 1 where direct input to the tone-control loops occurs, the separations between the detector stage and the high frequency loops may be an odd number of stages in each instance whereas the separations between the detector stage and the low frequency loops may be even for establishing this relationship. Some means for establishing this odd-even relationship between the two sets of frequencies herein is a prerequisite for using a single detector in a tone-control chip as described herein.

A further economy is achieved by employing a single rotating field for moving bubbles synchronously in both the storage and the tone-control chips herein. Such an arrangement is practicable so long as the storage chip provides for the compatible movement of the successive bubble codes queued in major path 15 of FIG. 1 for the 50 milliseconds during which tone-generation occurs. The formation of the major path into a recirculating loop and the provision for the annihilation for the foremost digit representation during each output operation results in such a practicable arrangement. Upon annihilation of the preceding code from the tone-control loops in each instance, a search for the next subsequent digit in the major loop would be instituted. Successive digits conveniently would be accompanied by different marker indications to expedite the search.

Of course, if a single field can be used for a storage and a tone-control chip, consolidation of the two chips into a single chip follows. Such a single chip would result in a bubble circuit useful for pushbutton station sets as described in the above-mentioned copending applications as well as for TOUCH-TONE sets. Discretionary bonding to the resulting chip would be used to select the mode of operation in this case.

It may be noted further that the tone-control loops in the embodiment of FIGS. 5 and 6 are one-half as long as the loops in the embodiment of FIG. 1. A 63.5 kilohertz rate for the in-plane field instead of the 127 kilohertz rate described for the embodiment of FIG. 1 allows the same multifrequencies as in the earlier embodiment with the use of much less chip area. The correspondence between the loop lengths and the separations between the detector and the ports to the loops ensures the odd-even relationships, mentioned above, at either frequency.

In summary then, in a bubble memory, particularly of the field-access type, employing a field rotating at a given frequency, sub-multiples of that frequency can be obtained for producing tones for TOUCH-TONE dailing. The sub-multiples are determined most simply by the selection of separations between coded stages in an accessing channel and a detector in that channel to which bubble codes are advanced periodically.

In practice, a double magnetoresistance detector is used. In such an arrangement, a detector is formed in each of two consecutive stages (or stage pairs) of the expansion detector arrangement as shown in FIG. 6 at 100. The detectors are electrically interconnected in a bridge arrangement for noise cancellation. The most convenient information format with such a double detectorarrangement is for bits to occupy alternative positions in memory detector arrangement described in the above-mentioned copending application.

What has been described is considered merely illustrative of the principles of this invention. Therefore, various embodiments can be devised by those skilled in the art in accordance with those principles within the spirit and scope of this invention as encompassed by the following claims.

What is claimed is:

1. Magnetic apparatus comprising a layer of material in which single wall domains can be moved, means for defining in said layer $n > 3$ multistage loops for recirculating domains thereabout periodically through first positions therein response to a magnetic field varying cyclically at frequency $f_1$, said loops being organized into $m < n$ groups of loops, means responsive to a first signal for selectively providing a domain in a coded loop of each of said $m$ groups of loops, accessing means for said loops, said accessing means comprising a multistage channel including a domain detector, said channel being operative responsive to said field for moving domains to said detector, said accessing means also including a plurality of spaced-apart first stages therein each associated with one of said first positions and spaced-apart coded numbers of stages from said detector, said $n$ loops including $n$ different numbers of stages.

2. Magnetic apparatus in accordance with claim 1 wherein the number of stages in each of said loops equals the number of stages separating the associated one of said first stages from said detector.

3. Magnetic apparatus in accordance with claim 1 wherein said accessing means comprises a multistage channel for the movement of single wall domains therealong and defined by magnetic elements adjacent a surface of said layer.

4. Magnetic apparatus in accordance with claim 1 wherein the number of stages separating each of said first stages and said detector is related to the number of stages in the associated loop such that a bubble in one of said $n$ loops moves to the corresponding first stage each time a bubble from said one loop arrives at said detector from the associated first stage.

5. Magnetic apparatus in accordance with claim 1 wherein said accessing means comprises a plurality of channels for the movement of single wall domains therealong, said channels being associated with different ones of said loops.

6. Magnetic apparatus in accordance with claim 1 wherein said means for selectively providing a domain includes a plurality of electrical conductors coupled to said layer in a manner to provide a domain in $m$ of said $n$ loops when pulsed selectively.

7. Magnetic apparatus in accordance with claim 1 wherein $n = 7$ and $m = 2$ for establishing a two-out-of-seven code therein.

8. Magnetic apparatus in accordance with claim 7 also including means for annihilating domains in said loops.

9. Magnetic apparatus in accordance with claim 8 also including means for controllably replicating domains in said first positions into the associated first stages.

10. Magnetic apparatus in accordance with claim 9 also including signal generating means coupled to said detector and responsive to the advance of a succession of domains by said detector for providing a pulse train determined by said coded numbers of stages and the frequency of said magnetic field.

11. Magnetic apparatus in accordance with claim 10 wherein said signal generating means comprises first and second flip-flops and means for enabling said flip-flops in the alternative for odd and even cycles of said magnetic field, respectively.

12. Magnetic apparatus in accordance with claim 11 wherein said first and second flip-flops are alternately activated and deactivated by successive domains in said odd and even cycles, respectively, the numbers of stages separating said coded stages and said detector being chosen to ensure that succeeding ones of said $m = 2$ pulses arrive at said detector during odd and even cycles of said magnetic field.

13. Magnetic apparatus in accordance with claim 12 wherein said loops and said accessing means are defined by multistage patterns of magnetic elements responsive to a magnetic field rotating in the plane of said layer for moving said domains therealong.

14. Magnetic apparatus in accordance with claim 9 wherein said means for replicating is responsive to the pressure of a domain at said detector for replicating domains from said first positions into associated ones of said first stages.

15. Magnetic apparatus in accordance with claim 5 wherein said accessing means comprises a multistage spur track associated with each of said plurality of channels, and a first electrical conductor coupled electrically in series to input stages of said spur tracks in a manner to generate when pulsed a domain in a stage in each of said spur tracks separated a different number of stages from associated ones of said loops, and means for replicating domains at said input stages simultaneously from said channels into said loops.

16. Magnetic apparatus in accordance with claim 15 including seven loops wherein three of said loops are associated with first stages of said spur tracks spaced an odd number of stages from said input stages and four of said loops are associated with first stages of spur tracks spaced an even number of stages from said input stages.

17. Magnetic apparatus in accordance with claim 16 also including a second electrical conductor coupled to said first positions for replicating domains from said spur track into said loops when pulsed.

18. Magnetic apparatus in accordance with claim 17 also including means responsive to an external signal for pulsing said first conductor and said second conductor in a timed sequence for generating a domain code in said spur tracks for movement therealong and for replicating said code into selected ones of said loops, respectively.

19. Magnetic apparatus in accordance with claim 13 wherein said loops are organized into first and second sets of three and four loops respectively and said means for providing domains in said loops is adapted to provide a domain in one loop in each of said sets, said first positions of said loops of said first and second sets being associated with ones of said first stages in said accessing means spaced from said detector coded numbers of stages to ensure arrival of domains at said detector during odd and even cycles of said magnetic field.

* * * * *